United States Patent
Kwon et al.

(10) Patent No.: US 11,779,871 B2
(45) Date of Patent: Oct. 10, 2023

(54) EXHAUST MODULE FOR WAFER BAKING APPARATUS AND WAFER PROCESSING SYSTEM HAVING THE SAME

(71) Applicant: XIA TAI XIN SEMICONDUCTOR (QING DAO) LTD., Qingdao (CN)

(72) Inventors: Byung-In Kwon, Singapore (SG); Jong-Kill Lim, Singapore (SG); Sungkun Jang, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 864 days.

(21) Appl. No.: 16/661,957

(22) Filed: Oct. 23, 2019

(65) Prior Publication Data
US 2020/0197851 A1 Jun. 25, 2020

Related U.S. Application Data

(60) Provisional application No. 62/784,299, filed on Dec. 21, 2018.

(51) Int. Cl.
*B01D 46/42* (2006.01)
*G03F 7/20* (2006.01)
(Continued)

(52) U.S. Cl.
CPC ........... *B01D 46/4263* (2013.01); *G03F 7/40* (2013.01); *B01D 2279/00* (2013.01); *G03F 7/70916* (2013.01)

(58) Field of Classification Search
CPC ............ B01D 46/4263; B01D 2279/00; B01D 53/005; B01D 53/185; B05C 9/14;
(Continued)

(56) References Cited

U.S. PATENT DOCUMENTS

2002/0006577 A1* 1/2002 Kimura ............. H01L 21/67109
118/69
2011/0265887 A1* 11/2011 Lee .................... H01L 21/67017
137/561 R
(Continued)

FOREIGN PATENT DOCUMENTS

| CN | 107390481 A | * | 11/2017 | ........... G02F 1/1303 |
| CN | 107390481 A | | 11/2017 | |
| KR | 20080055031 A | * | 6/2008 | ............... B08B 5/04 |

OTHER PUBLICATIONS

CN107390481A_ENG (Espacenet machine translation of Zhao) (Year: 2017).*
(Continued)

*Primary Examiner* — Gabriel E Gitman
(74) *Attorney, Agent, or Firm* — ScienBiziP, P.C.

(57) ABSTRACT

The present disclosure provides an exhaust module for exhausting an exhaust from at least one wafer baking apparatus having an exhaust port. The exhaust module includes at least one pipeline, a heating unit, a solvent dispensing unit, and a filtering unit. The at least one pipeline is connected to the exhaust port of the wafer baking apparatus and configured to exhaust the exhaust gas from the wafer baking apparatus. The heating unit is connected to the pipeline and configured to heat the exhaust gas. The solvent dispensing unit is connected to the heating unit and configured to dispense a solvent to cool and dissolve the exhaust gas. The filtering unit is connected to the solvent dispensing unit and configured to filter the solvent.

17 Claims, 4 Drawing Sheets

(51) Int. Cl.
*G03F 7/40* (2006.01)
*G03F 7/00* (2006.01)

(58) Field of Classification Search
CPC ... B05C 5/00; G03F 7/16; G03F 7/168; G03F 7/40; B05D 1/005; H05B 3/44; H01L 21/027; H01L 21/67017; H01L 21/67109; H01L 21/67075; H01L 21/67063; H01L 21/67034
See application file for complete search history.

(56) References Cited

U.S. PATENT DOCUMENTS

| | | | | |
|---|---|---|---|---|
| 2014/0029925 | A1* | 1/2014 | Smith | H05B 3/02 |
| | | | | 392/468 |
| 2014/0256160 | A1* | 9/2014 | Wada | H01L 21/02238 |
| | | | | 438/786 |
| 2016/0339359 | A1* | 11/2016 | Hallot | E21B 43/36 |
| 2017/0038682 | A1* | 2/2017 | Suwa | G03F 7/004 |

OTHER PUBLICATIONS

KR20080055031A_ENG (Espacenet machine translation of Lee) (Year: 2008).*

* cited by examiner

EXHAUST MODULE FOR WAFER BAKING APPARATUS AND WAFER PROCESSING SYSTEM HAVING THE SAME

CROSS-REFERENCE TO RELATED APPLICATION(S)

This application claims the benefit of U.S. Provisional Patent Application No. 62/784,299 filed on Dec. 21, 2018, the contents of which are incorporated by reference herein.

FIELD

The present disclosure generally relates to an exhaust module for a wafer baking apparatus and a wafer processing system having the same. More specifically, the present disclosure relates to an exhaust module having a heating unit, a solvent dispensing unit and a filtering unit.

BACKGROUND

In semiconductor manufacture, photolithography is a process that generates circuit patterns on a surface of a wafer using light-sensitive photoresist materials and controlled exposure to light. Applying and developing the photoresist materials involves several actions that are performed within enclosed chambers of a wafer track system. The wafer track system may include a spin coating apparatus and a wafer baking apparatus. In the spin coating apparatus, a photoresist solution containing the photoresist materials is spinning coated on the surface of the wafer. In the wafer baking apparatus, the wafer is heated on a hot plate in a baking chamber to evaporate the photoresist solvent in the photoresist solution.

In the wafer baking apparatus, the evaporated photoresist solvent must be continuously exhausted from the baking chamber. FIG. 1 is a schematic diagram of a wafer baking apparatus 110 connected to an exhaust pipe 130. A plurality of wafer baking apparatuses 110 may be connected to the exhaust pipe 130.

The exhaust pipe 130 has pipelines 120 connected to a baking chamber 111 of each of the wafer baking apparatuses 110. The temperature difference between the baking chamber 111 and the exhaust pipe 130 may cause condensation of the photoresist solvent. The condensed photoresist solvent may clog up the exhaust pipe 130. Maintaining and cleaning the exhaust pipe 130 is time-consuming and results in prolonged down time of the wafer backing apparatus 110.

Accordingly, there remains a need to prevent clogging in an exhaust pipe to reduce the down time of a wafer baking apparatus.

SUMMARY

In view of the above, an object of the present disclosure is to provide an exhaust module for a wafer baking apparatus to prevent clogging in the exhaust pipe.

To achieve the above object, an implementation of the present disclosure provides an exhaust module for exhausting an exhaust from at least one wafer baking apparatus. The exhaust module includes at least one pipeline, a heating unit, a solvent dispensing unit, and a filtering unit. The at least one pipeline is connected to an exhaust port of the wafer baking apparatus and configured to exhaust the exhaust gas from the wafer baking apparatus. The heating unit is connected to the pipeline and configured to heat the exhaust gas. The solvent dispensing unit is connected to the heating unit and configured to dispense a solvent to cool and dissolve the exhaust gas. The filtering unit is connected to the solvent dispensing unit and configured to filter the solvent dissolved with the exhaust gas.

To achieve the above object, another implementation of the present disclosure provides a wafer processing system. The wafer processing system includes at least one wafer baking apparatus configured to bake a wafer, and an exhaust module for exhausting an exhaust gas from the at least one wafer baking apparatus. The wafer baking apparatus includes a chamber having an exhaust port for accommodating the wafer, and a baking plate disposed in the chamber for baking the wafer. The exhaust module includes at least one pipeline, a heating unit, a solvent dispensing unit, and a filtering unit. The at least one pipeline is connected to the exhaust port of the wafer baking apparatus and configured to exhaust the exhaust gas from the wafer baking apparatus. The heating unit is connected to the pipeline and configured to heat the exhaust gas. The solvent dispensing unit is connected to the heating unit and configured to dispense a solvent to cool and dissolve the exhaust gas. The filtering unit is connected to the solvent dispensing unit and configured to filter the solvent dissolved with the exhaust gas.

To achieve the above object, yet another implementation of the present disclosure provides a method for exhausting an exhaust from at least one wafer baking apparatus. The method includes several actions. In an action, an exhaust module is connected to an exhaust port of the wafer baking apparatus. The exhaust module includes at least one pipeline, a heating unit, a solvent dispensing unit, and a filtering unit. In an action, the exhaust gas is exhausted from the exhaust port of the wafer baking apparatus through the pipeline of the exhaust module. In an action, the exhaust gas is heated in the heating unit of the exhaust module. In an action, a solvent is dispensed by the solvent dispensing unit to cool and dissolve the exhaust gas. In an action, the solvent is filtered by the filtering unit. In an action, the solvent is discharged from the filtering unit.

As described above, the exhaust module for a wafer baking apparatus of the implementations of the present disclosure includes a heating unit, a solvent dispensing unit, and a filter unit. The exhaust gas is heated in the heating unit to prevent condensation and clogging in the exhaust pipe. After being heated the heating unit, the exhaust gas is cooled and dissolved by a cool solvent dispensed from the solvent dispensing unit, and then filtered by the filtering unit. Therefore, the exhaust module of the present disclosure can prevent clogging of the exhaust pipe, and hence reduce down time of the wafer baking apparatus.

BRIEF DESCRIPTION OF THE DRAWINGS

Implementations of the present technology will now be described, by way of example only, with reference to the attached figures.

DETAILED DESCRIPTION

Figure 1:
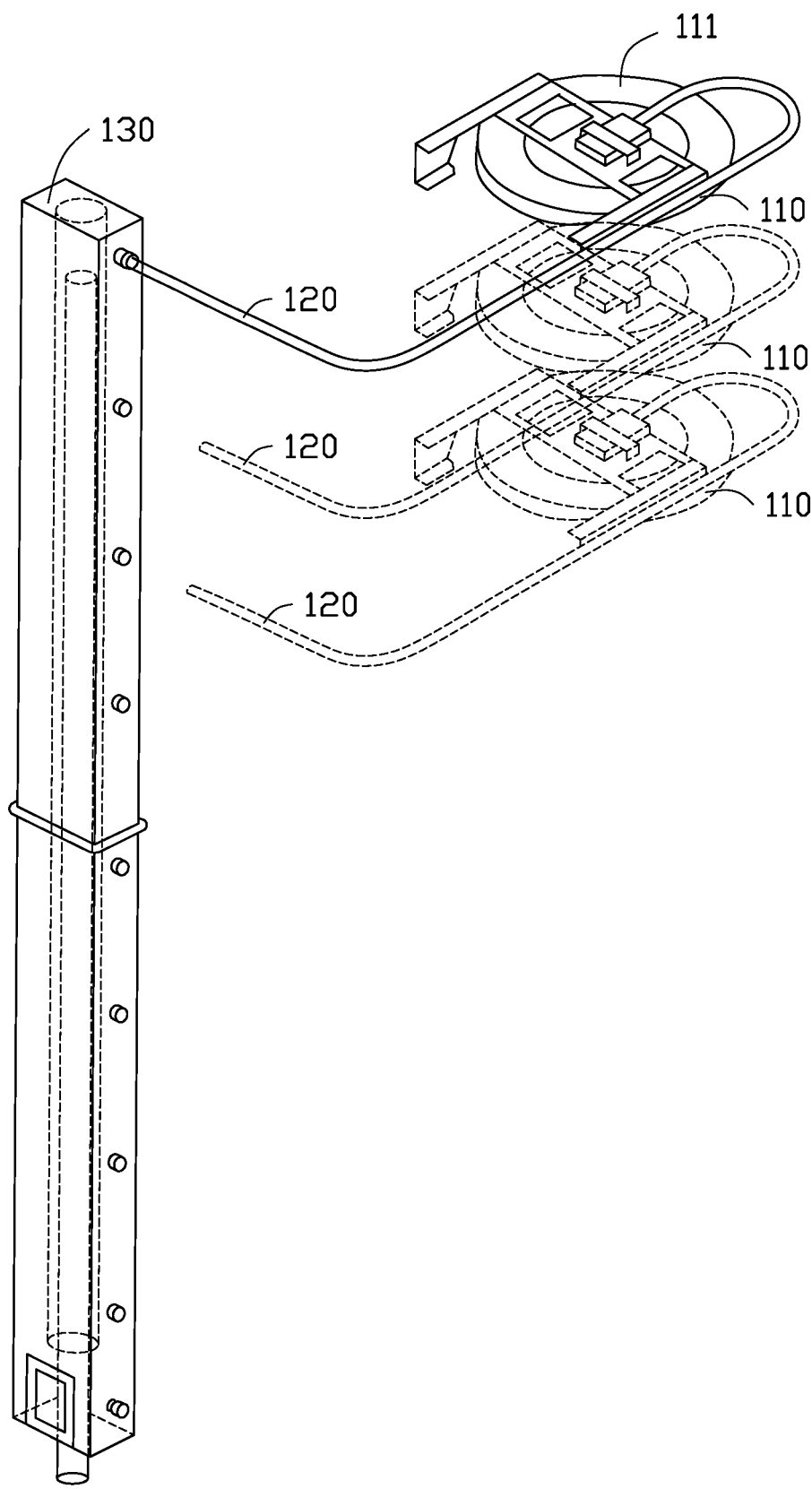
FIG. 1 is a schematic diagram of a conventional exhaust pipe for a wafer baking apparatus.

The present disclosure will now be described more fully hereinafter with reference to the accompanying drawings, in which exemplary implementations of the disclosure are shown. This disclosure may, however, be embodied in many different forms and should not be construed as limited to the exemplary implementations set forth herein. Rather, these exemplary implementations are provided so that this disclosure will be thorough and complete, and will fully convey the scope of the disclosure to those skilled in the art. Like reference numerals refer to like elements throughout.

The terminology used herein is for the purpose of describing particular exemplary implementations only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

It will be understood that the term "and/or" includes any and all combinations of one or more of the associated listed items. It will also be understood that, although the terms first, second, third etc. may be used herein to describe various elements, components, regions, parts and/or sections, these elements, components, regions, parts and/or sections should not be limited by these terms. These terms are only used to distinguish one element, component, region, part or section from another element, component, region, layer or section. Thus, a first element, component, region, part or section discussed below could be termed a second element, component, region, layer or section without departing from the teachings of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The description will be made as to the exemplary implementations of the present disclosure in conjunction with the accompanying drawings in FIGS. 2A to 3. Reference will be made to the drawing figures to describe the present disclosure in detail, wherein depicted elements are not necessarily shown to scale and wherein like or similar elements are designated by same or similar reference numeral through the several views and same or similar terminology.

The present disclosure will be further described hereafter in combination with the accompanying figures.

Figure 2A:
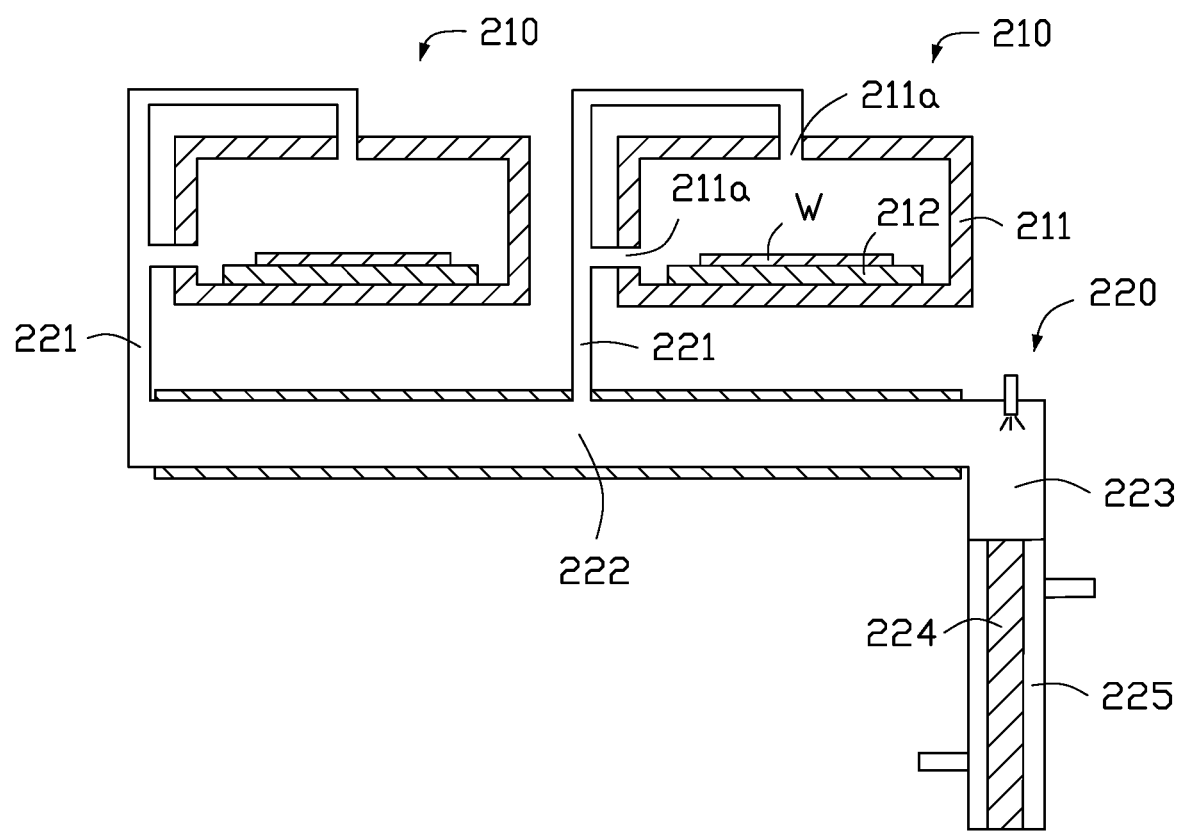
FIG. 2A is a schematic diagram of a wafer processing system according to an implementation of the present disclosure.

Referring to FIG. 2A, a schematic diagram of a wafer processing system 200 according to an implementation of the present disclosure is illustrated. The wafer processing system 200 may be a wafer track system. As shown in FIG. 2A, the wafer processing system 200 includes at least one wafer baking apparatus 210 and an exhaust module 220. The wafer processing system 200 may further include at least one spin coating apparatus (not shown in the figure). The wafer baking apparatus 210 is configured to bake a wafer W. The wafer W is coated with a layer of photoresist solution. The wafer baking apparatus 210 includes a chamber 211 having an exhaust port 211a and for accommodating the wafer W, and a baking plate 212 disposed in the chamber 211 for baking the wafer W. When the water W is heated or baked on the baking plate 212, photoresist solvent evaporates from the photoresist solution, and the wafer W is dried for the subsequent exposure processes. Evaporated photoresist solvent (e.g., exhaust gas) is continuously exhausted by the exhaust module 220 to prevent contamination of the wafer W.

Figure 2B:
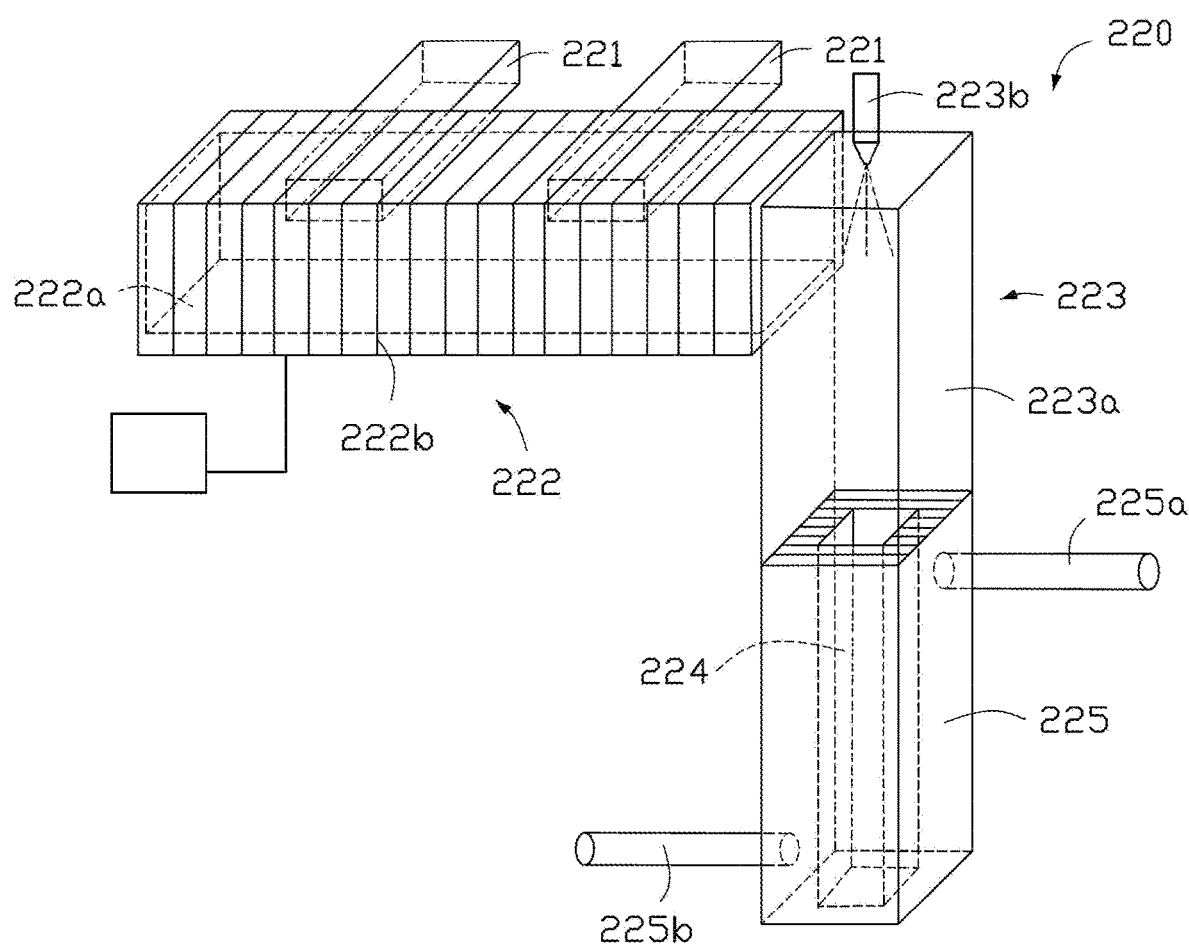
FIG. 2B is a schematic diagram of an exhaust module of the wafer processing system in FIG. 2A.

Referring to FIG. 2B, a schematic diagram of the exhaust module 220 of the wafer processing system 200 is illustrated. The exhaust module 220 is configured to exhaust the exhaust gas from the at least one wafer baking apparatus 210. The exhaust module 220 includes at least one pipeline 221, a heating unit 222, a solvent dispensing unit 223, and a filtering unit 224. The pipeline 221 is connected to the exhaust port 211a of the wafer baking apparatus 210 (shown in FIG. 2A) and configured to exhaust the exhaust gas from the wafer baking apparatus 210. The heating unit 222 is connected to pipeline 221 and configured to heat the exhaust gas. The heating unit 222 includes a heating pipe 222a and a film 222b surrounding the heating pipe 222a. The film 222b maybe a flexible polyimide insulation film that covers an outer surface of the heating pipe 222a. When the exhaust gas is exhausted from the chamber 211 of the wafer baking apparatus 210, the exhaust gas flows into the heating pipe 222a of the heating unit 222. The film 222b keeps the heating pipe 222a warm to prevent the exhaust gas from condensing in the heating pipe 222a.

Preferably, the heating unit 222 has an operating (heating) temperature within a range of 50 to 100 degrees Celsius.

The solvent dispensing unit 223 is connected to the heating unit 222 and configured to dispense a solvent to cool and dissolve the exhaust gas. The solvent dispensing unit 223 includes a solvent dispensing pipe 223a connected to the heating pipe 222a of the heating unit 222, and a nozzle 223b configured to dispense the solvent into the solvent dispensing pipe 223a. The solvent dispensed from the solvent dispensing unit 223 has a temperature within a range of 15 to 25 degrees Celsius. Preferably, the heating pipe 222a of the heating unit 222 is horizontally disposed. The solvent dispensing pipe 223a is vertically disposed. The exhaust gas is heated in the heating pipe 222a to prevent condensation and further clogging of the solvent in the heating pipe 222a and the pipelines 221. When the exhaust gas enters the solvent dispensing unit 223, the nozzle 223b dispenses the cool solvent having the temperature range of 15 to 25 degrees Celsius to reduce the temperature of the exhaust gas. Preferably, the solvent may be a mixture of 70 weight percent (wt %) of propylene glycol monomethyl ether and 30 wt % of propylene glycol monomethyl ether acetate (i.e., a thinner product sold under the name of OK73 thinner by Tokyo Ohka Kogyo Co., Ltd). The exhaust gas is cooled and dissolved in the solvent in the solvent dispensing pipe 223a to prevent the exhaust gas from flowing back into the heating pipe 222a of the heating unit 222. The solvent dissolved with the exhaust gas flows down along the solvent dispensing pipe 223a due to gravity and flow into the filtering unit 224. The filtering unit 224 is connected to the solvent dispensing pipe 223a of the solvent dispensing unit 223 and configured to filter the solvent dissolved with the exhaust gas. After being filtered, the solvent is then discharged from the filtering unit 224. The exhaust module 220 may further include a cooling water unit 225 coupled to the filtering unit 224 and configured to cool the filtering unit 224. The cooling water unit 225 includes an inlet 225a configured to introduce a cooling water into the cooling water unit 225, and an outlet 225b configured to discharge the cooling water. Preferably, the cooling water introduced into the inlet 225a of the cooling water unit 225 has a temperature within a range of 16 to 18 degrees Celsius. The cooling water unit 225 reduces the temperature of the filtering unit 224, and hence improves the performance of the filtering process.

Figure 3:
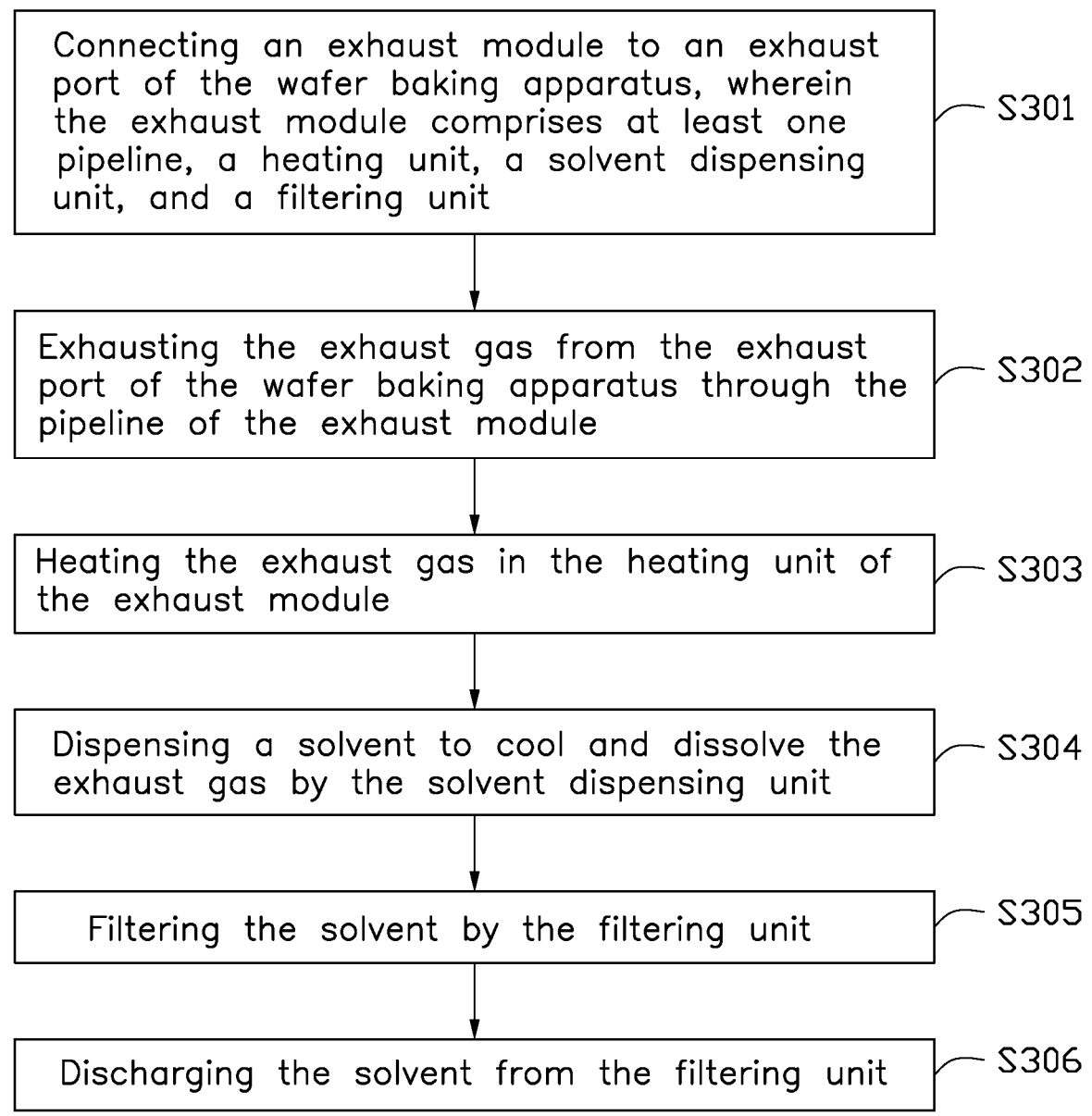
FIG. 3 is a flowchart of a method for exhausting an exhaust gas from at least one wafer baking apparatus according to another implementation of the present disclosure.

Referring to FIG. 3, a flowchart of a method for exhausting an exhaust gas from at least one wafer baking apparatus according to another implementation of the present disclosure. As shown in FIG. 3, the method S300 includes actions S301 to S306. In action S301, an exhaust module is connected to an exhaust port of the wafer baking apparatus. The exhaust module and the wafer baking apparatus may be included in a wafer processing system 200 referred to FIG. 2A. As shown in FIG. 2A, the wafer processing system 200 includes the at least one wafer baking apparatus 210 and the exhaust module 220. The wafer baking apparatus 210 is configured to bake a wafer W coated with a photoresist solution. The wafer baking apparatus 210 includes a chamber 211 having the exhaust port 211a for accommodating the wafer W, and a baking plate 212 disposed in the chamber 211. When the water W is heated or baked on the baking plate 212, photoresist solvent evaporates from the photoresist solution, and the wafer W is dried for the subsequent exposure processes. Evaporated photoresist solvent (i.e. exhaust gas) is continuously exhausted by the exhaust module 220 to prevent contamination of the wafer. FIG. 2B is a schematic diagram of the exhaust module 220 in FIG. 2A. The exhaust module 220 is configured to exhaust the exhaust gas from the at least one wafer baking apparatus 210. The exhaust module 220 includes at least one pipeline 221, a heating unit 222, a solvent dispensing unit 223, and a filtering unit 224.

In action S302, the exhaust gas is exhausted from the exhaust port 211a of the wafer baking apparatus 210 through the pipeline 221 of the exhaust module 220. In action S303, the exhaust gas is heated in the heating unit 222 of the exhaust module 220. In action S304, a solvent is dispensed by the solvent dispensing unit 223 to cool and dissolve the exhaust gas. In action S305, the solvent is filtered by the filtering unit 224. In action S306, the solvent is discharged from the filtering unit 224. The at least one pipeline 221 is connected to the exhaust port 211a of the wafer baking apparatus 210 and configured to exhaust the exhaust gas from the wafer baking apparatus 210. The heating unit 222 is connected to pipeline 221 and configured to heat the exhaust gas. The heating unit 222 includes a heating pipe 222a and a film 222b surrounding the heating pipe 222a. The film 222b maybe a flexible polyimide insulation film that covers an outer surface of the heating pipe 222a. When the exhaust gas is exhausted from the chamber 211 of the wafer baking apparatus 210, the exhaust gas flows into the heating pipe 222a of the heating unit 222. The film 222b keeps the heating pipe 222a warm to prevent the exhaust gas from condensing in the heating pipe 222a. Preferably, the heating unit 222 has an operating (heating) temperature within a range of 50 to 100 degrees Celsius.

As described above, the exhaust module for a wafer baking apparatus of the implementations of the present disclosure includes a heating unit, a solvent dispensing unit, and a filter unit. The exhaust gas is heated in the heating unit to prevent from condensation and clogging the exhaust pipe. After being heated the heating unit, the exhaust gas is cooled and dissolved by a cool solvent dispensed from the solvent dispensing unit, and then filtered by the filtering unit. Therefore, the exhaust module of the present disclosure can prevent clogging of the exhaust pipe, and hence reduce the down time of the wafer baking apparatus.

The implementations shown and described above are only examples. Many details are often found in the art such as the other features of an exhaust module for a wafer baking apparatus and a wafer processing system having the same. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the implementations described above may be modified within the scope of the claims.

What is claimed is:

1. An exhaust module for exhausting an exhaust gas from at least one wafer baking apparatus, comprising:
    at least one pipeline connected to an exhaust port of the at least one wafer baking apparatus and configured to exhaust the exhaust gas from the at least one wafer baking apparatus;
    a heating unit connected to the at least one pipeline and configured to heat the exhaust gas;
    a solvent dispensing unit connected to the heating unit and configured to dispense a solvent to cool and be dissolved in the exhaust gas; and
    a filtering unit connected to the solvent dispensing unit and configured to filter the solvent dissolved in the exhaust gas;
    wherein the heating unit comprises a heating pipe and a heat insulation film surrounding the heating pipe, and the solvent dispensing unit comprises a solvent dispensing pipe connected to the heating pipe of the heating unit and a nozzle configured to dispense the solvent into the solvent dispensing pipe.

2. The exhaust module of claim 1, wherein the heating unit has an operating temperature within a range of 50 to 100 degrees Celsius.

3. The exhaust module of claim 1, wherein the solvent dispensed from the solvent dispensing unit has a temperature within a range of 15 to 25 degrees Celsius.

4. The exhaust module of claim 1, further comprising a cooling water unit coupled to the filtering unit and configured to cool the filtering unit.

5. The exhaust module of claim 4, wherein the cooling water unit comprises an inlet configured to introduce a cooling water into the cooling water unit and an outlet configured to discharge the cooling water.

6. The exhaust module of claim 5, wherein the cooling water introduced into the inlet of the cooling water unit has a temperature within a range of 16 to 18 degrees Celsius.

7. The exhaust module of claim 1, wherein the heat insulation film of the heating unit is a flexible polyimide film.

8. The exhaust module of claim 1, wherein the heating pipe of the heating unit is horizontally disposed.

9. The exhaust module of claim 1, wherein the solvent dispensing pipe of the solvent dispensing unit is vertically disposed.

10. The exhaust module of claim 1, further comprising a controller coupled to the heating unit and configured to control an operating temperature of the heating unit.

11. A wafer processing system comprising:
    at least one wafer baking apparatus configured to bake a wafer, comprising:

a chamber for accommodating the wafer having an exhaust port; and a baking plate disposed in the chamber for baking the wafer; and an exhaust module for exhausting an exhaust gas from the at least one wafer baking apparatus, comprising:

at least one pipeline connected to the exhaust port of the chamber of the at least one wafer baking apparatus and configured to exhaust the exhaust gas from the at least one wafer baking apparatus;

a heating unit connected to the at least one pipeline and configured to heat the exhaust gas;

a solvent dispensing unit connected to the heating unit and configured to dispense a solvent to cool and be dissolved in the exhaust gas; and a filtering unit connected to the solvent dispensing unit and configured to filter the solvent dissolved in the exhaust gas;

wherein the heating unit of the exhaust module comprises a heating pipe and a heat insulation film surrounding the heating pipe, the solvent dispensing unit of the exhaust module comprises a solvent dispensing pipe connected to the heating pipe of the heating unit and a nozzle configured to dispense the solvent into the solvent dispensing pipe, the heating pipe of the heating unit is horizontally disposed, and the solvent dispensing pipe of the solvent dispensing unit is vertically disposed.

12. The wafer processing system of claim 11, wherein the heating unit of the exhaust module has an operating temperature within a range of 50 to 100 degrees Celsius.

13. The wafer processing system of claim 11, wherein the solvent dispensed from the solvent dispensing unit of the exhaust module has a temperature within a range of 15 to 25 degrees Celsius.

14. The wafer processing system of claim 11, wherein the exhaust module further comprising a cooling water unit coupled to the filtering unit and configured to cool the filtering unit.

15. A method for exhausting an exhaust gas from at least one wafer baking apparatus, comprising:

connecting an exhaust module to an exhaust port of the at least one wafer baking apparatus, wherein the exhaust module comprises at least one pipeline, a heating unit, a solvent dispensing unit, and a filtering unit;

exhausting the exhaust gas from the exhaust port of the at least one wafer baking apparatus through the at least one pipeline of the exhaust module;

heating the exhaust gas in the heating unit of the exhaust module;

dispensing a solvent to cool and be dissolved in the exhaust gas by the solvent dispensing unit; and filtering the solvent by the filtering unit;

wherein the heating unit comprises a heating pipe and a heat insulation film surrounding the heating pipe, and the solvent dispensing unit comprises a solvent dispensing pipe connected to the heating pipe of the heating unit and a nozzle configured to dispense the solvent into the solvent dispensing pipe.

16. The method of claim 15, wherein the exhaust gas is heated in the heating unit of the exhaust module at a temperature within a range of 50 to 100 degrees Celsius.

17. The method of claim 15, wherein the solvent dispensed by the solvent dispensing unit of the exhaust module has a temperature with a range of 15 to 25 degrees Celsius.

* * * * *